(12) United States Patent
Han

(10) Patent No.: US 7,101,759 B2
(45) Date of Patent: Sep. 5, 2006

(54) METHODS FOR FABRICATING NONVOLATILE MEMORY DEVICES

(75) Inventor: Chang Hun Han, Gyeonggi-do (KR)

(73) Assignee: Dongbu Electronics, Co., Ltd, Seoul (KR)

( * ) Notice: Subject to any disclaimer, the term of this patent is extended or adjusted under 35 U.S.C. 154(b) by 0 days.

(21) Appl. No.: 10/750,252

(22) Filed: Dec. 31, 2003

(65) Prior Publication Data

US 2004/0157422 A1   Aug. 12, 2004

(30) Foreign Application Priority Data

Dec. 31, 2002   (KR)   ............... 10-2002-0088281

(51) Int. Cl.
*H01L 21/8247* (2006.01)
(52) U.S. Cl. .................................... 438/257
(58) Field of Classification Search ........ 438/257–267, 438/593–594
See application file for complete search history.

(56) References Cited

U.S. PATENT DOCUMENTS

| | | | | |
|---|---|---|---|---|
| 5,858,847 A | * | 1/1999 | Zhou et al. ............. | 438/305 |
| 5,861,343 A | | 1/1999 | Tseng .................... | 438/666 |
| 5,866,448 A | * | 2/1999 | Pradeep et al. ......... | 438/231 |
| 6,306,708 B1 | * | 10/2001 | Peng ...................... | 438/266 |
| 6,483,146 B1 | | 11/2002 | Lee et al. ............... | 257/317 |
| 6,583,008 B1 | | 6/2003 | Lee et al. ............... | 438/257 |
| 6,627,524 B1 | * | 9/2003 | Scott ...................... | 438/588 |

* cited by examiner

*Primary Examiner*—Richard A. Booth
(74) *Attorney, Agent, or Firm*—Saliwanchik, Lloyd & Saliwanchik

(57) ABSTRACT

Methods of fabricating nonvolatile memory devices are disclosed. A disclosed method comprises forming a trench isolation layer on a substrate; forming an oxide layer and a polysilicon layer; forming a sacrificial layer on the polysilicon layer; forming a photoresist pattern on the sacrificial layer; performing an etching process using the photoresist pattern as a mask and, at the same time, attaching polymers on sidewalls of the etched sacrificial layer to form polymer layers, the polymers being generated from the etching of the sacrificial layer; and forming a floating gate and a tunnel oxide by removing part of the polysilicon layer and the oxide layer using the polymer layers and the photoresist pattern as a mask. The disclosed method can increase the width of a floating gate by using polymer layers in fabricating a two-bit type cell, thereby ensuring a higher coupling ratio compared to the coupling ratio of a conventional two-bit type cell.

9 Claims, 3 Drawing Sheets

METHODS FOR FABRICATING NONVOLATILE MEMORY DEVICES

FIELD OF THE DISCLOSURE

The present disclosure relates to methods for fabricating nonvolatile memory devices and, more particularly, to methods for fabricating a multi-bit flash memory cell by forming two (2) floating gates in one cell without increasing the cell size.

BACKGROUND

In a one-bit type EEPROM (electrically erasable programmable read only memory) cell, a device isolation layer 13 defining an active region and a device isolation region is formed in a substrate 11. A tunnel oxide 15 and a floating gate 17 are layered in the active region. In other words, the one-bit cell includes one floating gate per cell. The device isolation layer is formed through a LOCOS (local oxidation of silicon) or an STI (shallow trench isolation) process.

On the other hand, a two-bit type cell comprises two floating gates per cell. FIG. 1 is a cross-sectional view of a conventional EEPROM cell of the two-bit type. The two-bit type of EEPROM cell can share two (2) floating gates in one cell, whereas the one-bit type of EEPROM cell includes one floating gate in one cell.

However, in the prior art, when two floating gates have been formed in one cell, the cell size has increased as large as the lithographic minimum feature size (hereinafter referred to as "F"), such as a space size between the two floating gates. The minimum size of "F" is irrelevant to the smooth operation of a cell. Rather it is necessarily caused by limitations of the mask patterning. Therefore, it is preferable to reduce the "F" value in order to decrease cell size.

DETAILED DESCRIPTION

Figure 1:
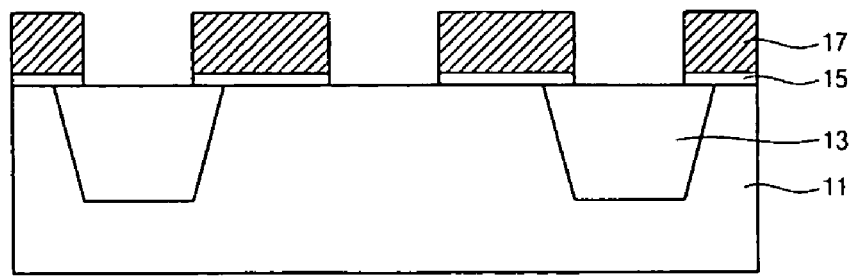
FIG. 1 is a cross-sectional view of a conventional 2-bit type EEPROM cell.
Figure 2A:
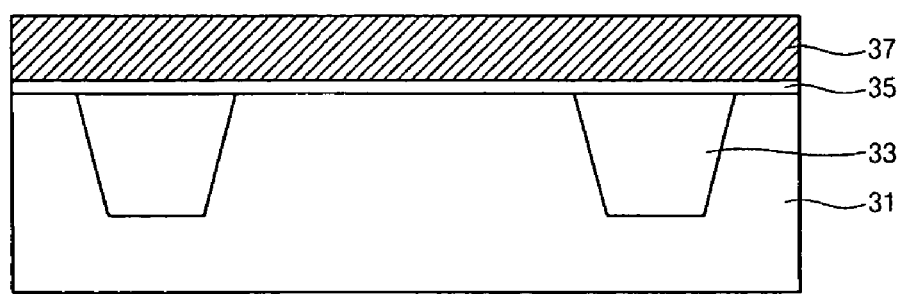
FIGS. 2a through 2g are cross-sectional views illustrating an example process for fabricating a nonvolatile memory device in accordance with the teachings of the present disclosure.

Referring to the example of FIG. 2a, a trench isolation layer 33 is formed in a silicon substrate 31. The trench isolation layer 33 defines an active region and a device isolation region in the substrate 31. An oxide layer 35 (for the formation of a tunnel oxide) and a polysilicon layer 37 (for the formation of a floating gate) are then sequentially formed on the substrate 31 and the trench isolation layer 33.

Figure 2B:
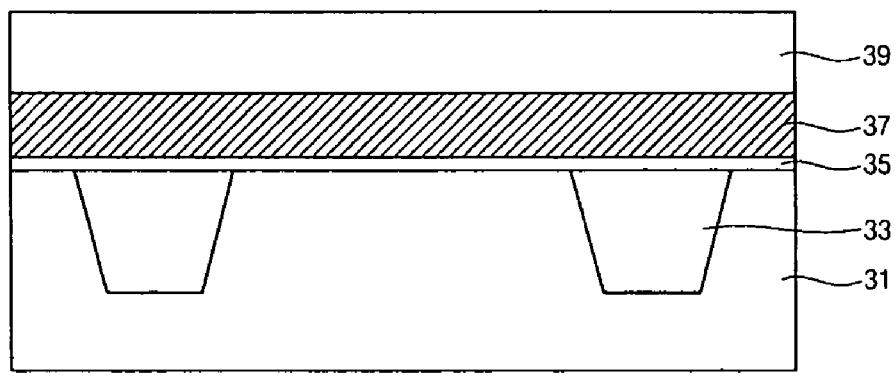

Referring to FIG. 2b, a first sacrificial layer 39 is formed on the polysilicon layer 37. The first sacrificial layer 39 is preferably formed of one selected from the group consisting of TEOS (tetraethyl orthosilicate) oxides and nitride.

Figure 2C:
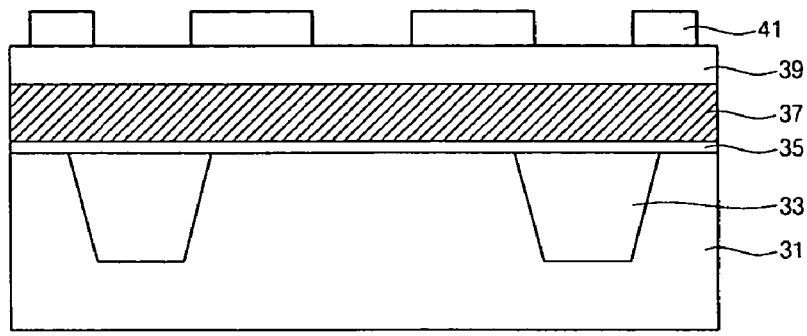

Referring to FIG. 2c, a photoresist pattern 41 is formed on the first sacrificial layer 39. The width of a region to be etched through the photoresist pattern 41 is the lithographic minimum feature size (F).

Figure 2D:
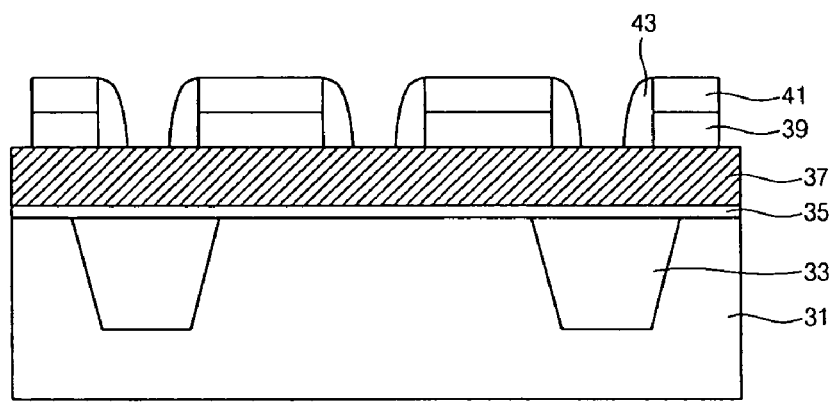

Referring to FIG. 2d, an etching process is performed using the photoresist pattern 41 as a mask to remove some part(s) of the first sacrificial layer 39 until the polysilicon layer 37 is exposed through the photoresist pattern 41. At the same time, polymers generated from the etching of the first sacrificial layer 39 are attached to the sidewalls of the etched first sacrificial layer 39 to form polymer layers 43. The polymer layers 43 are used as a second sacrificial layer. Here, the polymer layers 43 are formed so that the space between the adjacent polymer layers 43 is preferably between 300 Å and 1200 Å.

Figure 2E:
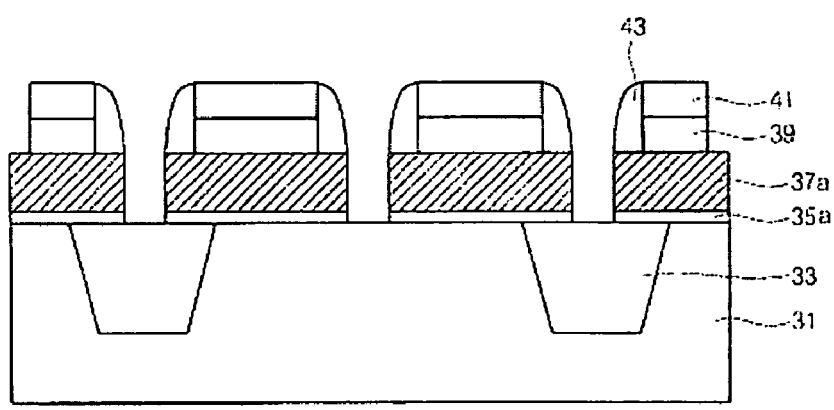

Referring to FIG. 2e, the exposed portion(s) of the polysilicon layer 37 and the oxide layer 35 beneath those portion(s) are etched by a dry etching process using the polymer layers 43 and the photoresist pattern 41 as a mask until the surface of the substrate 31 is exposed.

Figure 2F:
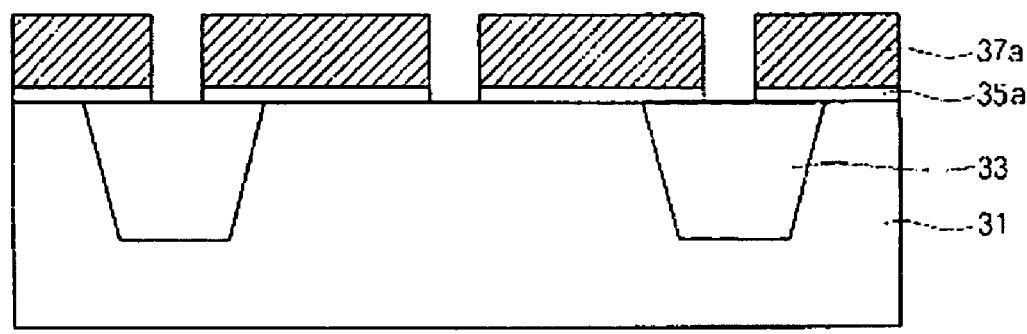

Referring to FIG. 2f, the polymer layers 43, the first sacrificial layer 39, and the photoresist pattern 41 are removed. As a result, a floating gate 37a and a tunnel oxide 35a are formed on the substrate 31. The width of the floating gate 37a is, thus, increased by the widths of the adjacent two polymer layers 43 attached to the sidewalls of the etched first sacrificial layer. As a result, the coupling ratio increases.

Figure 2G:
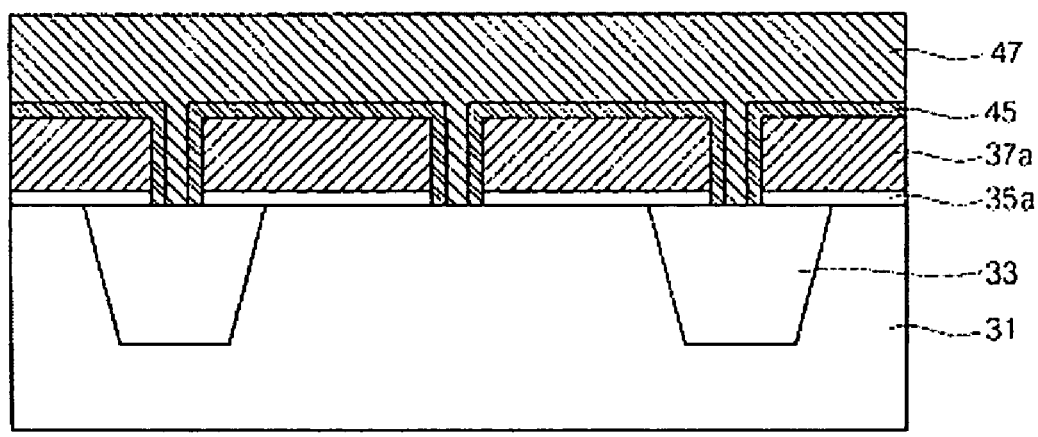

Referring to FIG. 2g, an insulating layer 45 and a polysilicon layer 47 (to form a control gate) are deposited over the substrate and the floating gate 37a and the tunnel oxide 35a.

The example methods disclosed herein can increase the width of a floating gate by using polymer layers 43 in fabricating a two-bit type memory cell. The increased width ensures a higher coupling ratio as compared to the coupling ratio of a conventional two-bit type cell. The example methods disclosed herein can reduce cell size and improve device reliability by reducing internal voltage.

From the foregoing, persons of ordinary skill in the art will appreciate that the above disclosed methods for fabricating nonvolatile memory devices can reduce the space between floating gates by forming polymer spacers. This reduction of the space between the gates increases the length of the floating gates without increasing the cell size.

An example method disclosed herein comprises: forming a trench isolation layer defining an active region and a non-active region in a substrate; forming an oxide layer for the formation of a tunnel oxide and a polysilicon layer for formation of a floating gate; forming a sacrificial layer on the polysilicon layer; forming a photoresist pattern on the sacrificial layer; performing an etching process using the photoresist pattern as a mask to remove some part of the sacrificial layer until the polysilicon layer is exposed through the photoresist pattern; and, at the same time, attaching polymers on the sidewalls of the etched sacrificial layer to form polymer layers, the polymers being generated from the etching of the sacrificial layer; and forming a floating gate and a tunnel oxide by removing some part of the polysilicon layer and the oxide layer using the polymer layers and the photoresist pattern as a mask.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a nonvolatile memory device comprising:
   forming an isolation layer and a non-active region in a semiconductor substrate;
   forming an oxide layer and a polysilicon layer on the substrate;
   forming a sacrificial layer on the polysilicon layer;
   patterning the sacrificial layer to form polymer layers on sidewalls of the sacrificial layer, wherein patterning the sacrificial layer to form polymer layers on sidewalls of the sacrificial layer comprises:

forming a photoresist pattern on the sacrificial layer, and etching portion of the sacrificial layer through the photoresist pattern, the polymer layers being generated from the etching of the sacrificial layer; and forming a floating gate and a tunnel oxide using the sacrificial layer and the polymer layers as an etching mask.

2. A method as defined in claim 1, further comprising:

removing the polymer layers and the sacrificial layer; and forming an insulating layer and a polysilicon layer over the substrate, the floating gate, and the tunnel oxide.

3. A method as defined in claim 1, wherein the sacrificial layer is formed of one selected from the group consisting of TEOS (tetraethyl orthosilicate) oxides and nitride.

4. A method as defined in clalm 1, wherein a space between two adjacent polymer layers is between 300 Å and 1200 Å.

5. A method as defined in claim 1, wherein the polymer layers on the sidewalls of the sacrificial layer are separated by less than a lithographic minimum feature size.

6. A method for fabricating a nonvolatile memory device comprising:

forming an isolation layer and a non-active region in a semiconductor substrate;

fanning an oxide layer and a polysilicon layer on the substrate;

forming a first sacrificial layer on the polysilicon layer;

forming a second sacrificial layer on the tb-st sacrificial layer;

etching the first sacrificial layer using the second sacrificial layer as a mask to form polymer layers on sidewalls of the first and the second sacrificial layers, the polymer layers being generated from the etching of the first sacrificial layer; and forming a floating gate and a tunnel oxide using the first and the second sacrificial layers and the polymer layers as an etching mask.

7. A method as defined in claim 6, further comprising:

removing the polymer layers, the first sacrificial layer and the second sacrificial layer; and forming an insulating layer and a polysilicon layer over the substrate, the floating gate, and the tunnel oxide.

8. A method as defined in claim 6, wherein the polymer layers on the sidewalls of the first and the second sacrificial layers are separated by less than a lithographic minimum feature size.

9. A method as defined in claim 6, wherein the second sacrificial layer comprises a patterned photoresistive material.

* * * * *

UNITED STATES PATENT AND TRADEMARK OFFICE
CERTIFICATE OF CORRECTION

PATENT NO. : 7,101,759 B2
APPLICATION NO. : 10/750252
DATED : September 5, 2006
INVENTOR(S) : Chang Hun Han It is certified that error appears in the above-identified patent and that said Letters Patent is hereby corrected as shown below:

Column 3,
Line 27, "fanning" should read --forming--.

Column 4,
Line 2, "tb-st" should read --first--.

Signed and Sealed this

Tenth Day of April, 2007

JON W. DUDAS
*Director of the United States Patent and Trademark Office*